(12) United States Patent
Valencia et al.

(10) Patent No.: US 10,862,466 B2
(45) Date of Patent: Dec. 8, 2020

(54) DYNAMIC TIME CONSTANT FOR QUICK DECISION LEVEL ACQUISITION

(71) Applicant: Semtech Corporation, Camarillo, CA (US)

(72) Inventors: Miguel Valencia, Bristol (GB); Nikolaos Vogiatzis, Bristol (GB)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 16/271,824

(22) Filed: Feb. 9, 2019

(65) Prior Publication Data

US 2020/0259485 A1 Aug. 13, 2020

(51) Int. Cl.
*H03K 5/00* (2006.01)
*H03K 5/003* (2006.01)
*H04B 10/25* (2013.01)
*H04B 10/27* (2013.01)

(52) U.S. Cl.
CPC ............ *H03K 5/003* (2013.01); *H04B 10/25* (2013.01); *H04B 10/27* (2013.01)

(58) Field of Classification Search
CPC ......... H03K 5/003; H04B 10/25; H04B 10/27
See application file for complete search history.

(56) References Cited

U.S. PATENT DOCUMENTS

| | | | | |
|---|---|---|---|---|
| 6,823,024 B2* | 11/2004 | Wagner | ................. | H04L 25/063 375/219 |
| 7,525,898 B2* | 4/2009 | Kanda | .................... | G11B 7/005 369/124.13 |
| 7,663,441 B2* | 2/2010 | Kang | ........................ | H03F 1/26 330/124 R |
| 7,760,003 B2* | 7/2010 | Wu | ....................... | H03H 11/245 327/306 |
| 7,933,575 B2* | 4/2011 | Chung | ..................... | H04B 1/30 327/552 |
| 8,497,733 B2* | 7/2013 | Takahashi | ........... | H03F 3/45475 327/124 |
| 8,963,607 B1* | 2/2015 | Oswal | .................... | H03K 5/003 327/307 |
| 2007/0286611 A1 | 12/2007 | Weber et al. | | |

FOREIGN PATENT DOCUMENTS

EP 1791276 A1 5/2007
WO 2011109770 A2 9/2011

* cited by examiner

*Primary Examiner* — Dinh T Le
(74) *Attorney, Agent, or Firm* — Robert D. Atkins; Patent Law Group: Atkins and Associates, P.C.

(57) ABSTRACT

A circuit controls a dynamic time constant to remove DC offset from a received optical data signal. The circuit has a first capacitor coupled between a first terminal and a second terminal. A first resistance network is coupled between the second terminal and a reference voltage. A control circuit has a first output coupled to a control input of the first resistance network. The control circuit monotonically increases an effective resistance of the first resistance network to increase the dynamic time constant. The first resistance network has a resistor coupled to the second terminal, and a transistor with a first conduction terminal coupled to the resistor, a second conduction terminal coupled to the reference voltage, and a control terminal coupled to the first output of the control circuit. The first capacitor has a variable capacitance. The monotonic increase in the dynamic time constant can be linear or non-linear.

14 Claims, 8 Drawing Sheets

DYNAMIC TIME CONSTANT FOR QUICK DECISION LEVEL ACQUISITION

FIELD OF THE INVENTION

The present invention relates in general to a passive optical network and, more particularly, to a level acquisition circuit with a dynamic time constant.

BACKGROUND OF THE INVENTION

A gigabit passive optical network (GPON) provides high speed data communications, over a fiber optical cable, between an internet service provider (ISP) and end user. A GPON uses point-to-multipoint architecture (1:32) or (1:64) with a fiber optic splitter to serve multiple end-points from a single optical source. For example, the GPON includes an optical line terminal (OLT) at the ISP central office or switching center and a plurality of optical network units (ONU) or optical network terminals (ONT) located near the end users. Each ONU serves an individual end user. A GPON reduces the amount of fiber and central office equipment as compared with other networks since unpowered fiber optic splitters are used to enable a single optical fiber to serve multiple end-points.

The GPON is a shared network, in that the OLT sends a stream of data packets as downstream traffic that is seen by all ONUs. The OLT transmitter and ONU receiver operate in continuous mode (CM). Each ONU reads the content of the data packets that correspond to the particular ONU address. Encryption prevents eavesdropping on downstream traffic. However, in the upstream channel, the ONU typically cannot transmit the optical data signal in CM, because there are more ONUs than OLTs and the receive timing of the optical data signal is variable. Instead, signals are combined using a multiple access protocol, such time division multiple access (TDMA). Therefore, a given ONU transmits an optical packet in an assigned time slot using burst mode (BM) transmission. All ONUs use the same clock frequency as the OLT as they extract the frequency from the downstream channel by using a clock and data recovery (CDR) circuit.

Many ONUs are geographically dispersed and operate at least partially out-of-phase because of the distance and delay to the OLT. The optical signals from different ONUs also experience different attenuation. Accordingly, the OLT receives BM optical packages from different ONUs that are asynchronous, out-of-phase, and with different amplitudes. The OLT must compensate for signal degradation, such as DC offset, from the phase and amplitude variation of the optical signal.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
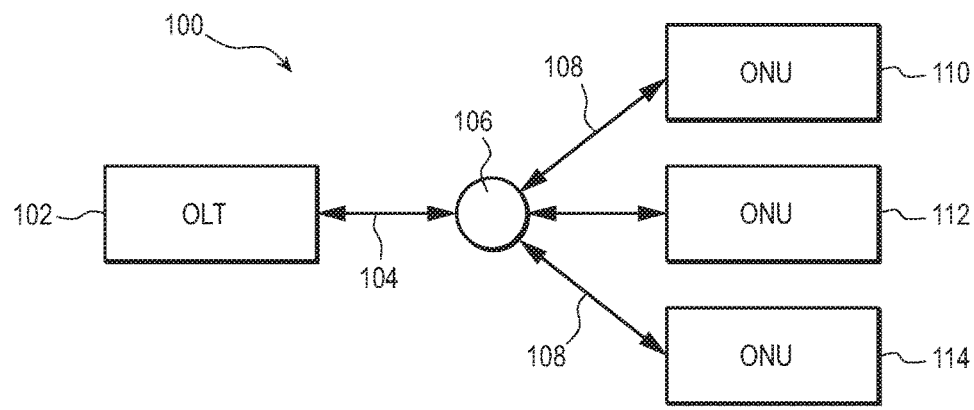
FIG. 1 illustrates a gigabit passive optical network with OLT, optical splitter, and a plurality of ONUs.

FIG. 1 illustrates GPON 100 providing high speed data communications, over fiber optical cable, between an ISP and end users. GPON 100 includes OLT 102 located within the ISP home office or switching center. OLT 102 makes connection with the internet. OLT 102 is coupled through fiber optical cable 104 to optical splitter 106, which provides multiple optical signal paths through fiber optical cables 108 to ONU 110, 112, and 114 located near end users. In one embodiment, optical splitter 106 connects up to 32 or 64 ONUs and brings optical fiber cabling and signals to the end user.

GPON 100 is a shared network, in that OLT 102 sends a stream of data packets as downstream traffic through fiber optical cables 104 and 108 to ONU 110-114. Each ONU 110-114 reads the content of the data packets that correspond to the particular ONU address. Encryption prevents eavesdropping on downstream traffic. In the upstream channel, the ONU transmits the optical data signal using a multiple access protocol, such TDMA. A given ONU transmits an optical packet in an assigned time slot using BM transmission. All ONUs use the same clock frequency as the OLT as they extract the frequency from the downstream channel by using a CDR circuit.

The present invention is also applicable to gigabit ethernet passive optical network (GEPON), EPON, 10G-EPON, XGPON, XGSPON, 25G-EPON, 50G-EPON, and other burst PON applications for sending data packets.

Figure 2:
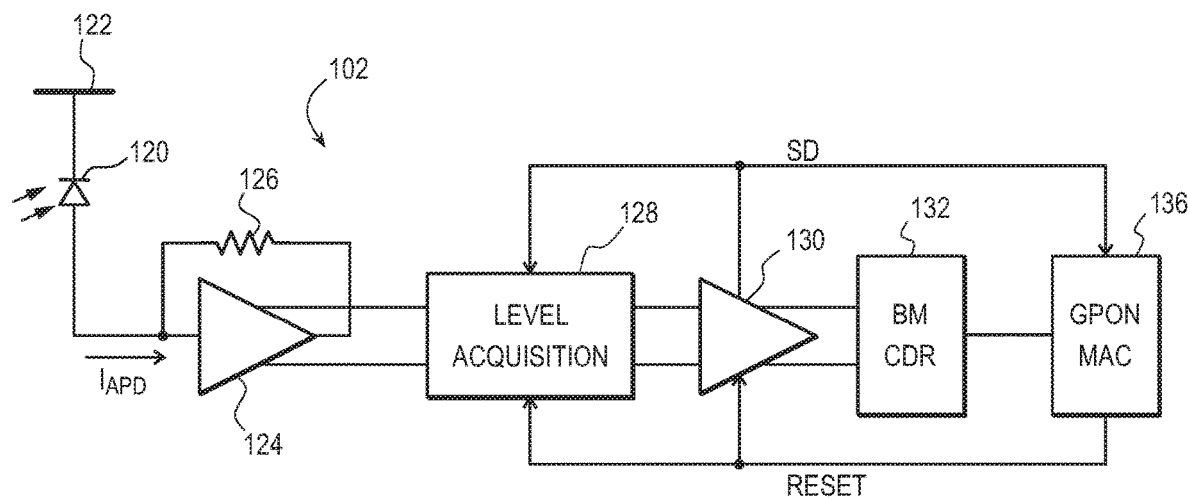
FIG. 2 illustrates further detail of the OLT of the GPON.

FIG. 2 illustrates further detail of the receiver portion of OLT 102, i.e., receiving the upstream optical data signal in bursts from GNU 110-114. Avalanche photodiode (APD) 120 detects the upstream optical data signal from GNU 110-114. The cathode of APD 120 is coupled to a positive power supply conductor 122, and the anode is coupled to an input of burst mode (BM) transimpedance amplifier (TIA) 124. APP 120 converts the optical data signal to current. $I_{APD}$. BM TIA 124 converts $T_{APD}$ to a voltage representative of the received optical data signal, and resistor 126 sets the gain of BM TIA 124. The differential output of BM TIA 124 is coupled to a differential input of level acquisition circuit 128. The differential output of level acquisition circuit 128 is coupled to a differential input of BM limiting amplifier (LIA) 130, and the differential output of BM LIA 130 is coupled to a differential input of BM CDR 132. GPON medium access control (MAC) 136 controls the communication between downstream data and upstream data. GPON MAC 136 generates RESET at each burst cycle to reset level acquisition circuit 128 and BM LIA 130.

Figure 3:
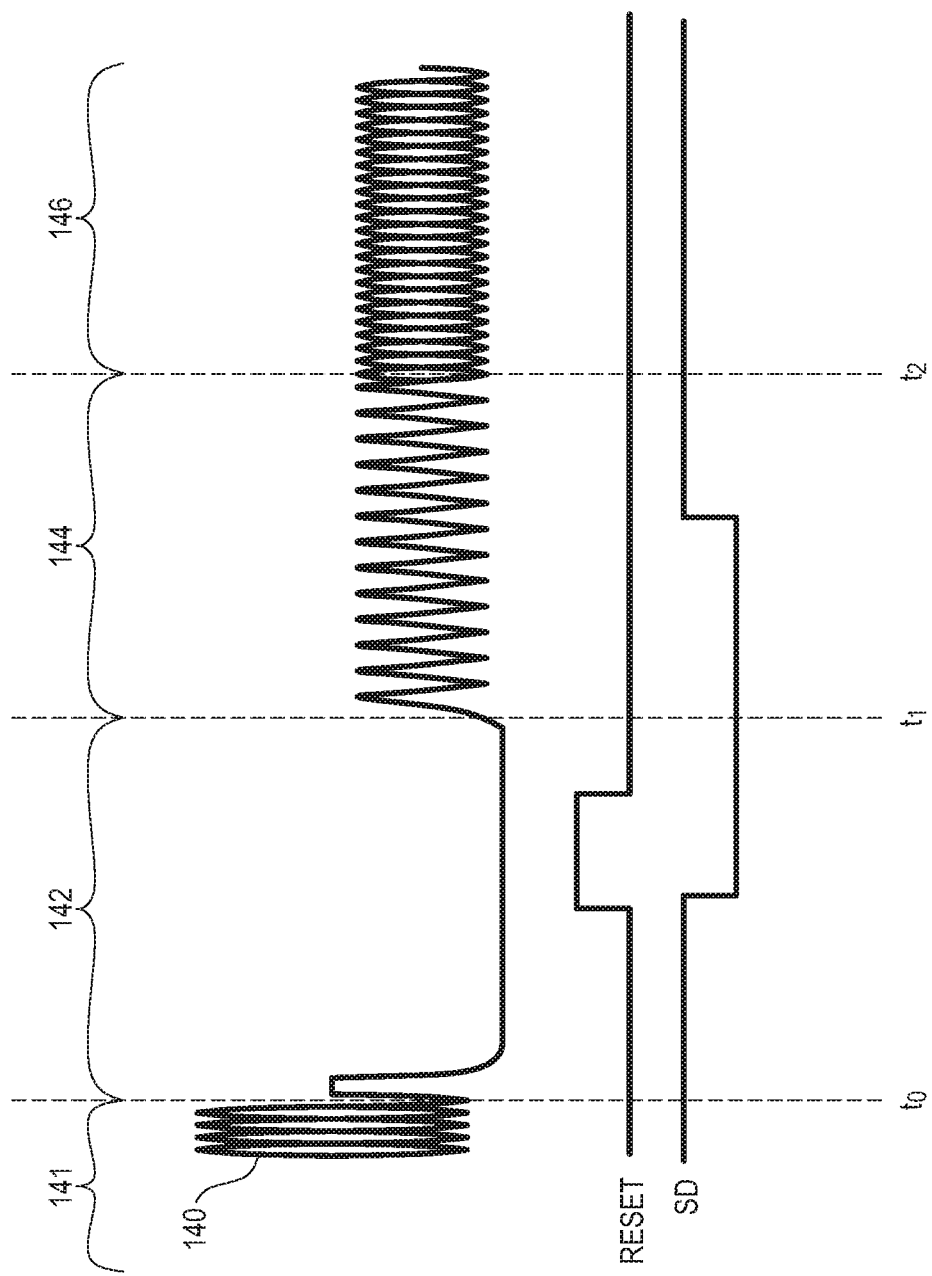
FIG. 3 illustrates a timing diagram of a received data signal and control signals.

An upstream data signal 140 is received by APD 120 of OLT 102 in FIG. 3. Time $t_0$ marks the end of a previous burst cycle 141. Guard interval 142 ensures that ONUs 110-114 do not interfere with one another, or otherwise cause overlapping transmissions. During guard interval 142, GPON MAC 136 generates RESET to prepare for processing the next burst of data. The incoming burst of data has an unknown amplitude that must be accommodated or compensated for. BM LIA 130 keeps asserted the signal detect SD from the previous burst. Signal detect SD is reset or cleared by RESET from the MAC 136. RESET may arrive from MAC 136 either during guard time interval 142 or during preamble 144. Preamble 144 begins at time $t_1$ with a sequence of one optical level followed by a zero optical level. Signal detect SD asserts at some point during preamble 144 and remains asserted until it is cleared by another RESET. BM TIA 124 and BM LIA 130 use the time period of preamble 144 to compensate for amplitude variation of data signal 140 and for BM 132 to phase-align with the transmitting ONU. The next data payload 146 begins at time $t_2$. Guard time 142 and preamble 144 represent overhead of the communication protocol and should be short in duration, e.g., 25.7 nanosecond (ns) guard time and 35.4 ns preamble at 1.244 Gbps.

Figure 4:
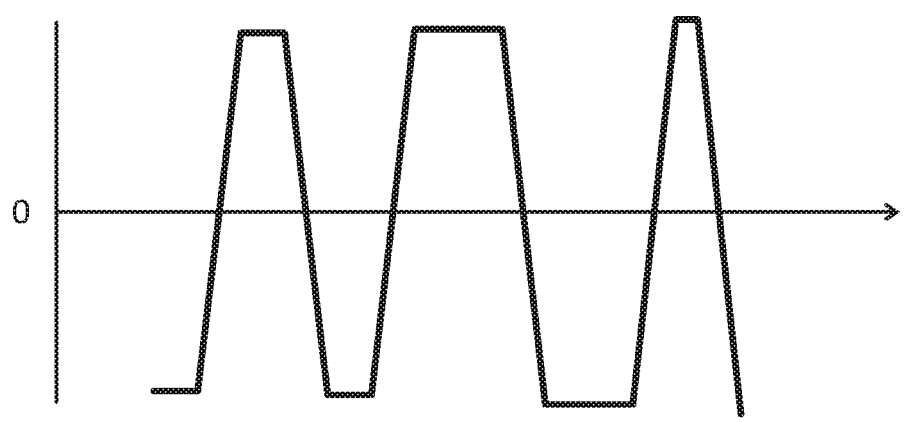
FIG. 4 illustrates the differential output signal of the BM TIA symmetrical about a zero reference signal.

BM TIA 124 handles a wide range of amplitude variations in data payload 146, i.e., the amplitude of the data signal may be high or low. In the ideal case, the differential output signal of BM TIA 124 is symmetrical about a reference signal, such as 0.0 VDC, see FIG. 4. When the differential signal swings around a different voltage, that voltage difference to the ideal zero level is a DC offset. There should be no DC offset of the differential signal with respect to the reference signal (0.0 VDC). However, the optical signal from ONU 110 may be attenuated more or less than the optical signal from ONU 112 or 114. Accordingly, the optical signal from ONU 110 may have an amplitude greater than or less than the optical signal from ONU 112 or 114. Note that data burst 141 has a greater amplitude as compared to data payload 146. Due to such system variation, e.g., changes in optical signal amplitude from one burst to another burst, as well as variations in delay from ONU 110-114 to OLT 102, the differential output signal of BM TIA 124 may have a non-zero DC offset with respect to the reference signal (0.0 VDC) that varies with the amplitude of the input optical signal. Level acquisition circuit 128 creates a dynamic time constant for each burst cycle to remove or compensate for the DC offset from the differential signal from BM TIA 124. Under present design standards, there is a short time to remove the DC offset.

Figure 5:
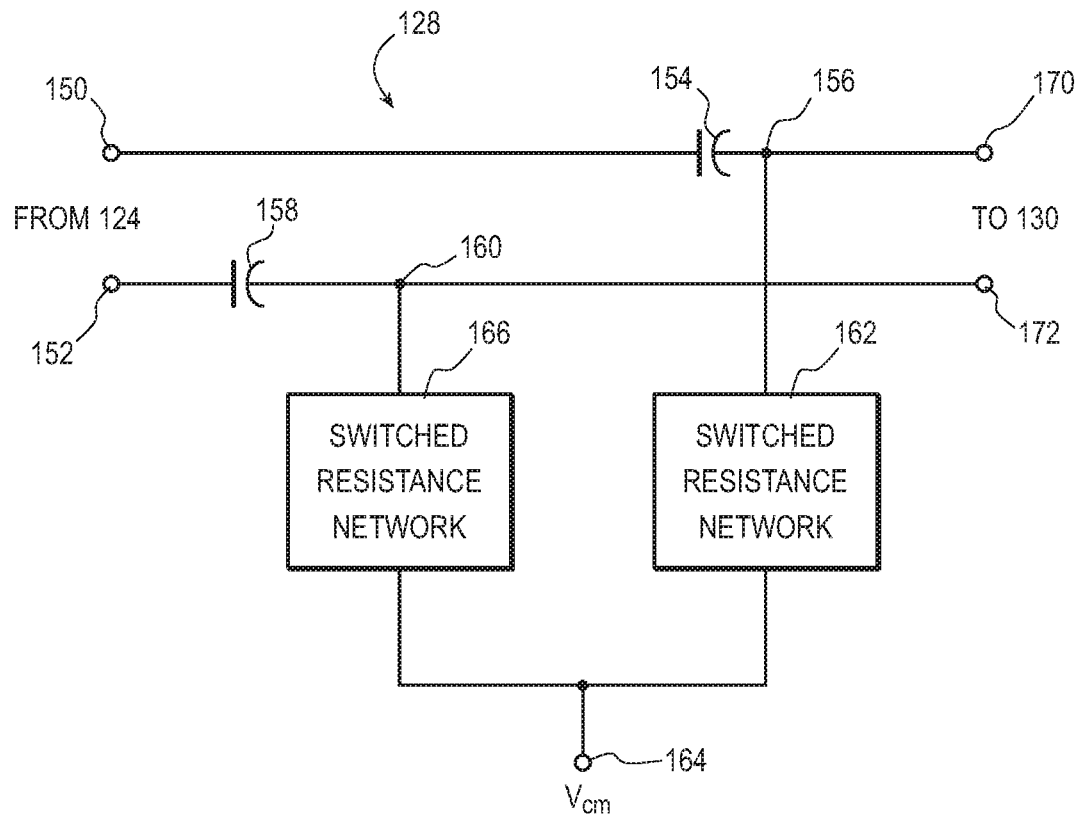
FIG. 5 illustrates further detail of the level acquisition circuit in the OLT.

FIG. 5 shows further detail of level acquisition circuit 128. The differential signal from BM TIA 124 is applied to terminals 150 and 152 of level acquisition circuit 128. Capacitor 154 is coupled between terminal 150 and node 156, and capacitor 158 is coupled between terminal 152 and node 160. Switched resistance network 162 is coupled between node 156 and terminal 164. Terminal 164 receives a reference voltage $V_{CM}$ corresponding to the input common mode of BM LIA 130. The combination of capacitor 154 and switched resistance network 162 creates a first variable time constant for the differential signal. Switched resistance network 166 is coupled between node 160 and terminal 164. The combination of capacitor 158 and switched resistance network 166 creates a second variable time constant for the differential signal. Terminals 170 and 172 are coupled to BM LIA 130. Capacitors 154 and 158 are coupled in the signal path between terminals 150-152 and terminals 170-172 and will block the DC component (remove the DC offset) of data signal 140, given the proper dynamic time constants. In differential mode, the difference between voltages across capacitors 154 and 158 is the DC offset that will be removed during the dynamic time constants.

Capacitor 154 is charged with a time constant $T_1$ equal to $C_{154}$ (capacitance of capacitor 154)*$R_{162}$ (total effective resistance of switched resistance network 162). Capacitor 158 is charged with a time constant $T_2$ equal to $C_{158}$ (capacitance of capacitor 158)*$R_{166}$ (total effective resistance of switched resistance network 166). To remove or compensate for the DC offset from the differential signal, the time constants $T_1$ and $T_2$ are dynamically changed during the acquisition of the offset.

The dynamic time constants $T_1$ and $T_2$ involve setting or configuring switched resistance networks 162 and 166 each with a minimum value of resistance to compensate for a large proportion of the DC offset. The dynamic time constants $T_1$ and $T_2$ are minimum values. The DC offset decreases rapidly (maximum rate of decrease). Switched resistance networks 162 and 166 are then set to larger values, less than the maximum selectable value of $R_{162}$ and $R_{166}$. The dynamic time constants $T_1$ and $T_2$ gradually increases as the DC offset rate of decrease begins to slow down to remove the pattern dependency. Switched resistance networks 162 and 166 are then set to even larger values, and the dynamic time constants $T_1$ and $T_2$ become even larger and the DC offset decreases. The process of monotonic increasing $R_{162}$ and $R_{166}$, and corresponding increasing the dynamic time constants $T_1$ and $T_2$, continues as the DC offset correspondingly decreases. In the last step, switched resistance networks 162 and 166 are set to maximum resistance, and the dynamic time constants $T_1$ and $T_2$ become maximum to remove the remaining DC offset. The dynamic time constants $T_1$ and $T_2$ effectively remove the DC offset from differential signal 140 in a controlled manner and in a short time period, e.g., less than 25.7 ns for GPON.

Figure 6:
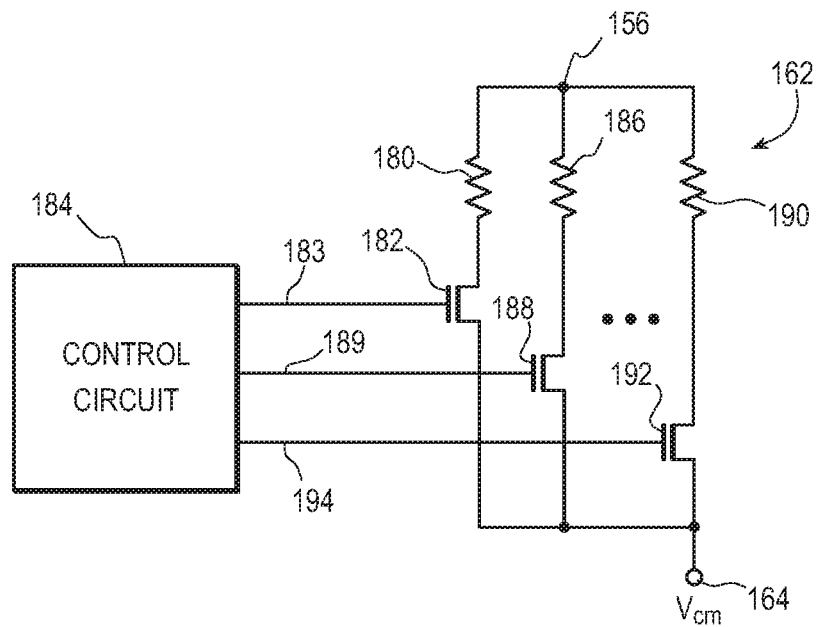
FIG. 6 illustrates further detail of the switched resistance network in the level acquisition circuit of FIG. 5.

FIG. 6 illustrates further detail of switched resistance network 162. Resistor 180 is coupled between node 156 and the drain of transistor 182. The gate of transistor 182 is coupled to output 183 of control circuit 184, and the source of transistor 182 is coupled to terminal 164. Resistor 186 is coupled between node 156 and the drain of transistor 188. The gate of transistor 188 is coupled to output 189 of control circuit 184, and the source of transistor 188 is coupled to terminal 164. Resistor 190 is coupled between node 156 and the drain of transistor 192. The gate of transistor 192 is coupled to output 194 of control circuit 184, and the source of transistor 192 is coupled to terminal 164.

In FIG. 6, $R_{162}$ is the parallel combination of those resistors 180, 186, and 190 having respective conducting transistors. Resistor 180 is smallest value, resistor 186 is a midrange value, and resistor 190 is the largest value. For minimum $R_{162}$, output 183, 189, and 194 are high, transistors 182, 188, and 192 are conductive, and $1/R_{162}=1/R_{180}+1/R_{186}+1/R_{190}$ (parallel combination of $R_{180}$, $R_{186}$, $R_{190}$). For midrange $R_{162}$, output 183 is low and outputs 189 and 194 are high, transistor 182 is non-conductive and transistors 188 and 192 are conductive, and $1/R_{162}=1/R_{186}+1/R_{190}$. For maximum $R_{162}$, outputs 183 and 189 are low and output 194 is high, transistors 182 and 188 are non-conductive and transistor 192 is conductive, and $R_{162}=R_{190}$. Additional resistors and transistors combinations can be connected and controlled, as described above, for more levels of switched resistance. Switched resistance network 166 follows a similar structure and operation.

Figure 7A:
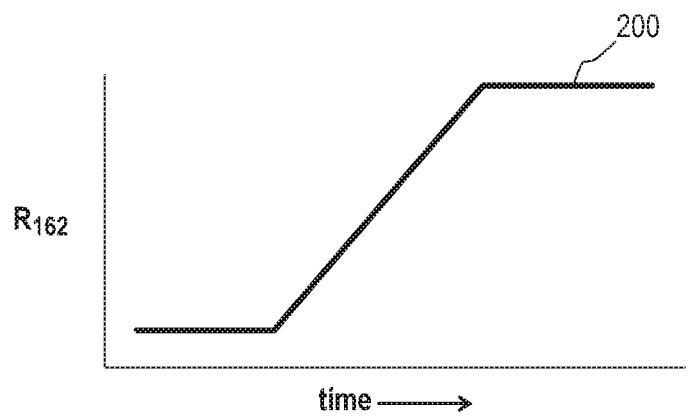
FIGS. 7a-7c illustrate linear and non-linear control of the switched resistance network in FIG. 6.
Figure 7B:
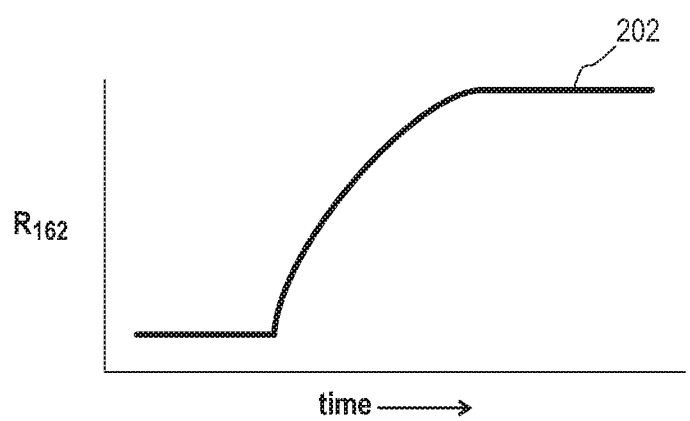
Figure 7C:
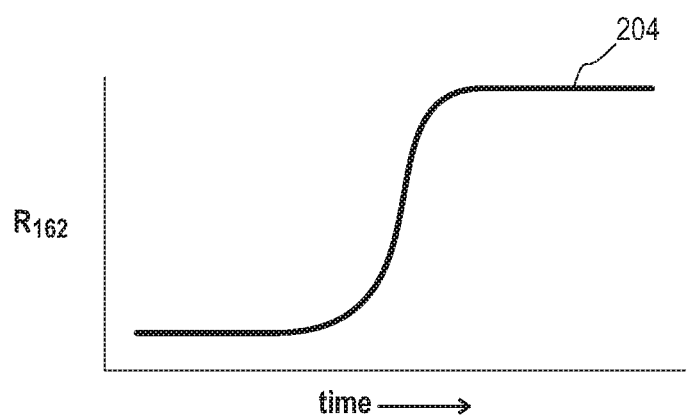

FIG. 7a shows a resistance plot 200 of switched resistance network 162 monotonically increasing $R_{162}$ from a minimum value to a maximum value in a linear manner. FIG. 7b shows a resistance plot 202 of switched resistance network 162 monotonically increasing $R_{162}$ from a minimum value to a maximum value in a non-linear manner. FIG. 7c shows a resistance plot 204 of switched resistance network 162 monotonically increasing $R_{162}$ from a minimum value to a maximum value in another non-linear manner. The process can be reversed in that the switched resistance network 162 can be monotonically decreasing $R_{162}$ from a maximum to a minimum value. In one embodiment, switched resistance network 162 can be selected from 5 ohms to 20 k ohms with 5-10 levels of switched resistance. Capacitor 154 has a value of 30-80 picofarads (pF). Alternatively, switched resistance network 162 can be selected from 50 ohms to 800 k ohms with 5 or more levels of switched resistance. Capacitor 154 has a value of 10-20 pF. Switched resistance network 166 follows a similar structure and operation. The monotonically increasing $R_{162}$ and $R_{166}$, in combination with capacitors 154 and 158, create the dynamic time constants $T_1$ and $T_2$ to effectively remove the DC offset from differential signal 140 in a controlled manner and in a short time period, e.g., less than 25.7 ns.

Figure 8:
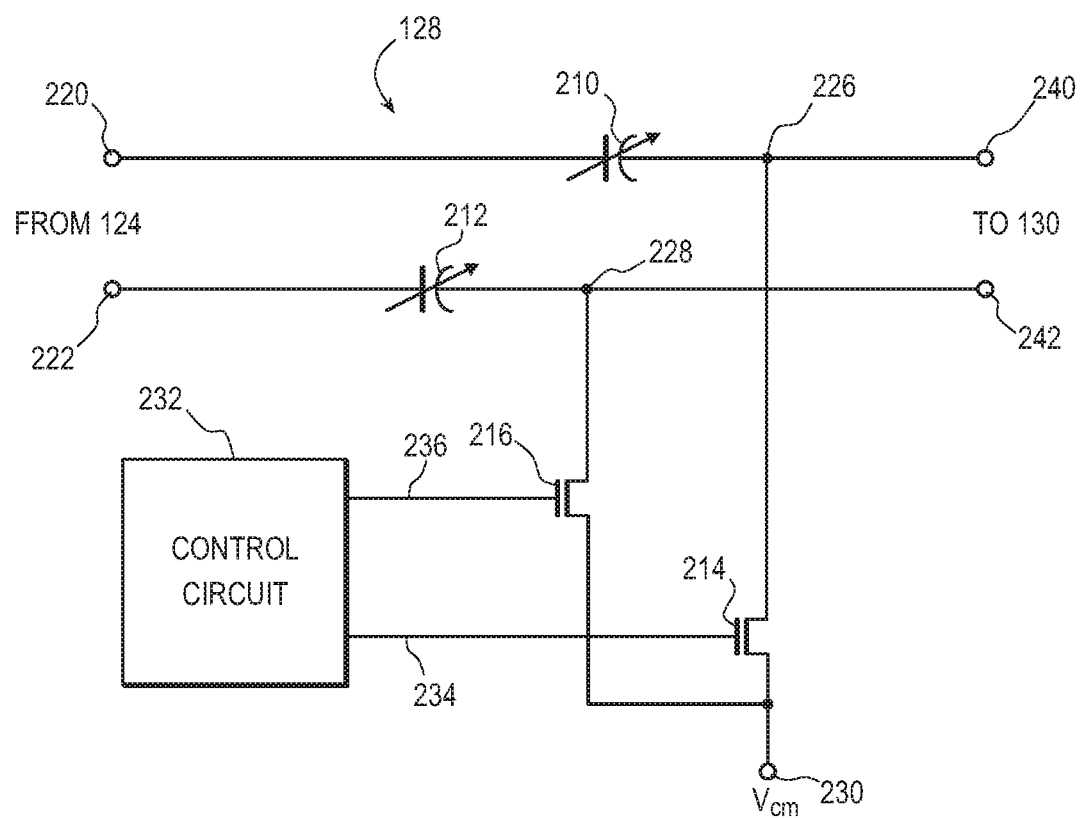
FIG. 8 illustrates another embodiment of the switched resistance network in the level acquisition circuit.

FIG. 8 illustrates another embodiment of level acquisition circuit 128 with variable capacitors 210 and 212, and variable drain-source resistance in a conductive state (RDSON) for transistors 214 and 216. Variable capacitors 210 and 212 can be implemented as a varactor. The differential signal from BM TIA 124 is applied to terminals 220 and 222 of level acquisition circuit 128. Variable capacitor 210 is coupled between terminal 220 and node 226, and variable capacitor 212 is coupled between terminal 222 and node 228. The drain of transistor 214 is coupled to node 226, and the source of transistor 214 is coupled to terminal 230. Terminal 230 receives a reference voltage $V_{CM}$ equal to the input common mode of BM LIA 130. The drain of transistor 216 is coupled to node 228, and the source of transistor 216 is coupled to terminal 230. Control circuit 232 provides output 234 to the gate of transistor 214 and output 236 to the gate of transistor 216. The combination of variable capacitor 210 and transistor 214 creates a first variable time constant for the differential signal. The combination of variable capacitor 212 and transistor 216 creates a second variable time constant for the differential signal. Terminals 240 and 242 are coupled to BM LIA 130. Capacitors 210 and 212 are coupled in the signal path between terminals 220-222 and 240-242 and will block the DC component (remove the DC offset) of data signal 140, given the proper dynamic time constants. In differential mode, the difference between voltages across capacitors 210 and 212 is the DC offset that will be removed during the dynamic time constant.

Capacitor 210 is charged with a time constant $T_1$ equal to $C_{210}$ (variable capacitance of capacitor 210)*$R_{214}$ (RDSON of transistor 214). Capacitor 212 is charged with a time constant $T_2$ equal to $C_{212}$ (variable capacitance of capacitor 212)*$R_{216}$ (RDSON of transistor 216). To remove or compensate for the DC offset from the differential signal, the time constants $T_1$ and $T_2$ are dynamically changed during the acquisition of the offset. In this case, the values of $C_{210}$, $C_{212}$, $R_{214}$, and $R_{216}$ can all be varied.

The dynamic time constants involve setting variable capacitors 210 and 212, and setting RDSON of transistors 214 and 216 with a minimum value of resistance to compensate for a large proportion of the DC offset. The value of RDSON of transistors is a function of gate voltage from outputs 234 and 236 of control circuit 232. The dynamic time constants $T_1$ and $T_2$ are minimum values. The DC offset decreases rapidly (maximum rate of decrease). The RDSON of transistors 214 and 216 are then set to larger values, less than the maximum selectable value of $R_{214}$ and $R_{216}$, by changing the gate voltage from outputs 234 and 236. The dynamic time constants $T_1$ and $T_2$ gradually increases as the DC offset rate of decrease begins to slow down to remove the pattern dependency. The RDSON of transistors 214 and 216 are then set to larger values, and the dynamic time constants $T_1$ and $T_2$ become even larger and the DC offset decreases. The process of monotonic increasing $R_{214}$ and $R_{216}$, and corresponding increasing the dynamic time constants $T_1$ and $T_2$, continues as the DC offset correspondingly decreases. In the last step, the RDSON of transistors 214 and 216 are set to maximum resistance, and the dynamic time constants $T_1$ and $T_2$ become maximum to remove the remaining DC offset. The dynamic time constants $T_1$ and $T_2$ effectively remove the DC offset from differential signal 140.

Figure 9A:
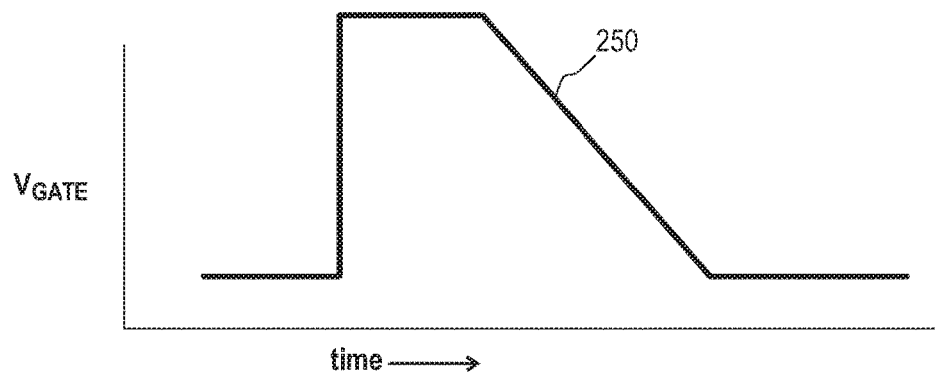
FIGS. 9a-9c illustrate linear and non-linear control of the switched resistance network in FIG. 8.
Figure 9B:
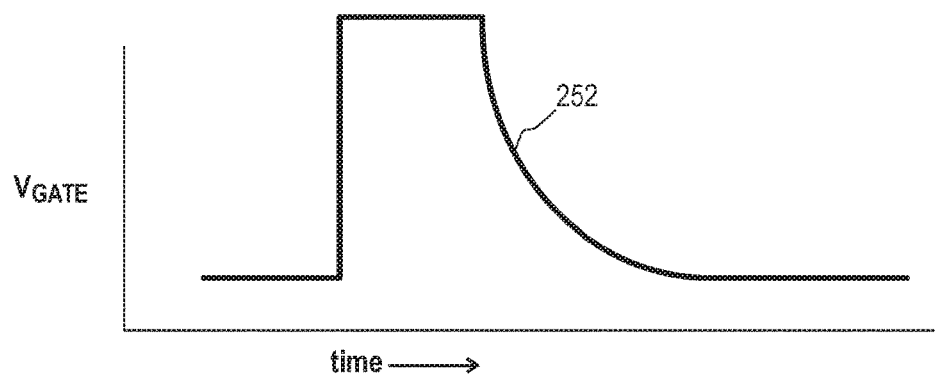
Figure 9C:
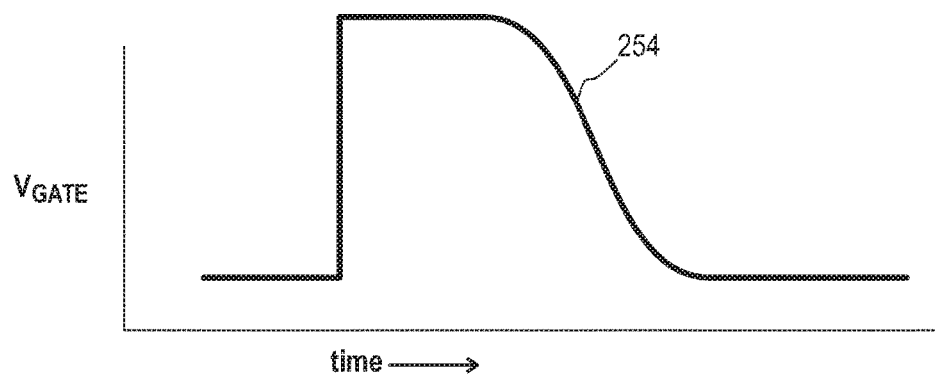

FIG. 9a shows a gate voltage $V_{GATE}$ plot 250 transistor 214 monotonically increasing $R_{214}$ from a minimum value to a maximum value in a linear manner. FIG. 9b shows a gate voltage $V_{GATE}$ plot 252 of transistor 214 monotonically increasing $R_{214}$ from a minimum value to a maximum value in a non-linear manner. FIG. 9c shows a gate voltage $V_{GATE}$ plot 254 of transistor 214 monotonically increasing $R_{214}$ from a minimum value to a maximum value in another non-linear manner.

Figure 10:
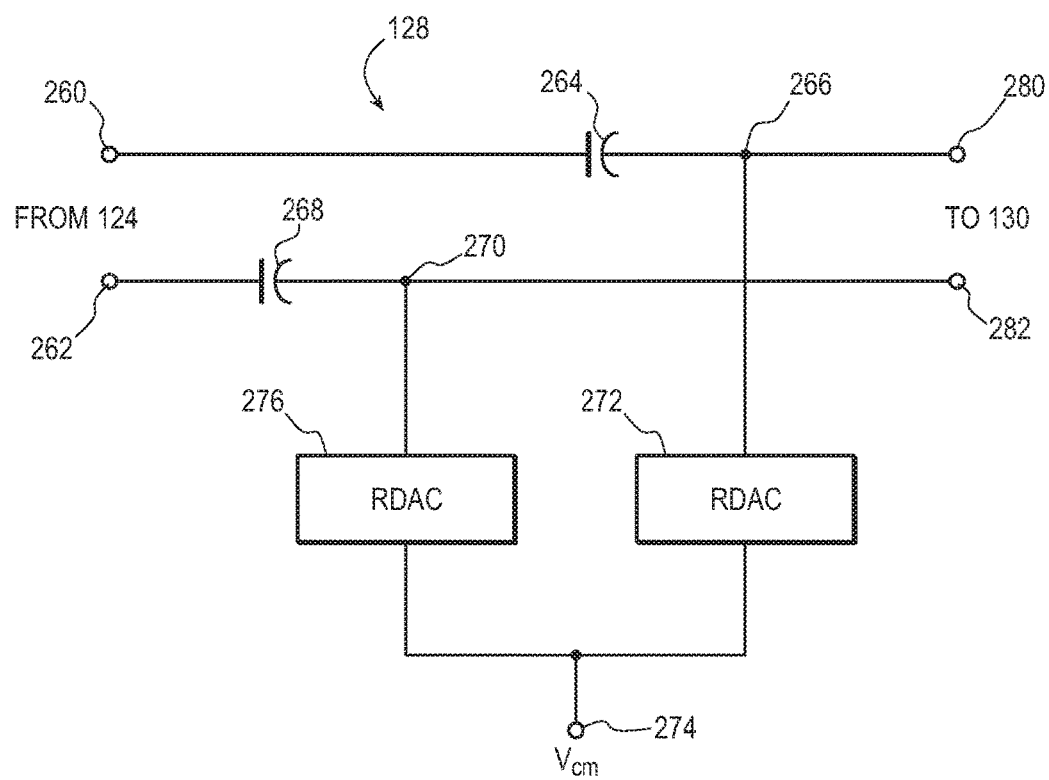
FIG. 10 illustrates another embodiment of the level acquisition circuit.

FIG. 10 shows another embodiment of level acquisition circuit 128. The differential signal from BM TIA 124 is applied to terminals 260 and 262 of level acquisition circuit 128. Capacitor 264 is coupled between terminal 260 and node 266, and capacitor 268 is coupled between terminal 262 and node 270. Resistor digital to analog converter (RDAC) 272 is coupled between node 266 and terminal 274. Terminal 274 receives a reference voltage $V_{CM}$ equal to the input common mode of BM LIA 130. The combination of capacitor 264 and RDAC 272 creates a first variable time constant for the differential signal. RDAC 276 is coupled between node 270 and terminal 274. The combination of capacitor 268 and RDAC 276 creates a second variable time constant for the differential signal. Terminals 280 and 282 are coupled to BM LIA 130. Capacitors 264 and 268 are coupled in the signal path between terminals 260-262 and terminals 280-282 and will block the DC component (remove the DC offset) of data signal 140, given the proper dynamic time constants.

Capacitor 264 is charged with a time constant $T_1$ equal to $C_{264}$ (capacitance of capacitor 264)*$R_{272}$ (total effective resistance of RDAC 272). Capacitor 268 is charged with a time constant $T_2$ equal to $C_{268}$ (capacitance of capacitor 268)*$R_{276}$ (total effective resistance of RDAC 276). To remove or compensate for the DC offset from the differential signal, the time constants $T_1$ and $T_2$ are dynamically changed during the acquisition of the offset.

The dynamic time constants $T_1$ and $T_2$ involve setting or configuring RDAC 272 and 276 each with a minimum value of resistance to compensate for a large proportion of the DC offset. The dynamic time constants $T_1$ and $T_2$ are minimum values. The DC offset decreases rapidly (maximum rate of decrease). RDAC 272 and 276 are then set to larger values, less than the maximum selectable value of $R_{272}$ and $R_{276}$. The dynamic time constants $T_1$ and $T_2$ gradually increases as the DC offset rate of decrease begins to slow down to remove the pattern dependency. RDAC 272 and 276 are then set to even larger values, and the dynamic time constants $T_1$ and $T_2$ become even larger and the DC offset decreases. The process of monotonic increasing $R_{272}$ and $R_{276}$, and corresponding increasing the dynamic time constants $T_1$ and $T_2$, continues as the DC offset correspondingly decreases. In the last step, RDAC 272 and 276 are set to maximum resistance, and the dynamic time constants $T_1$ and $T_2$ become maximum to remove the remaining DC offset. The dynamic time constants $T_1$ and $T_2$ effectively remove the DC offset from differential signal 140.

Figure 11:
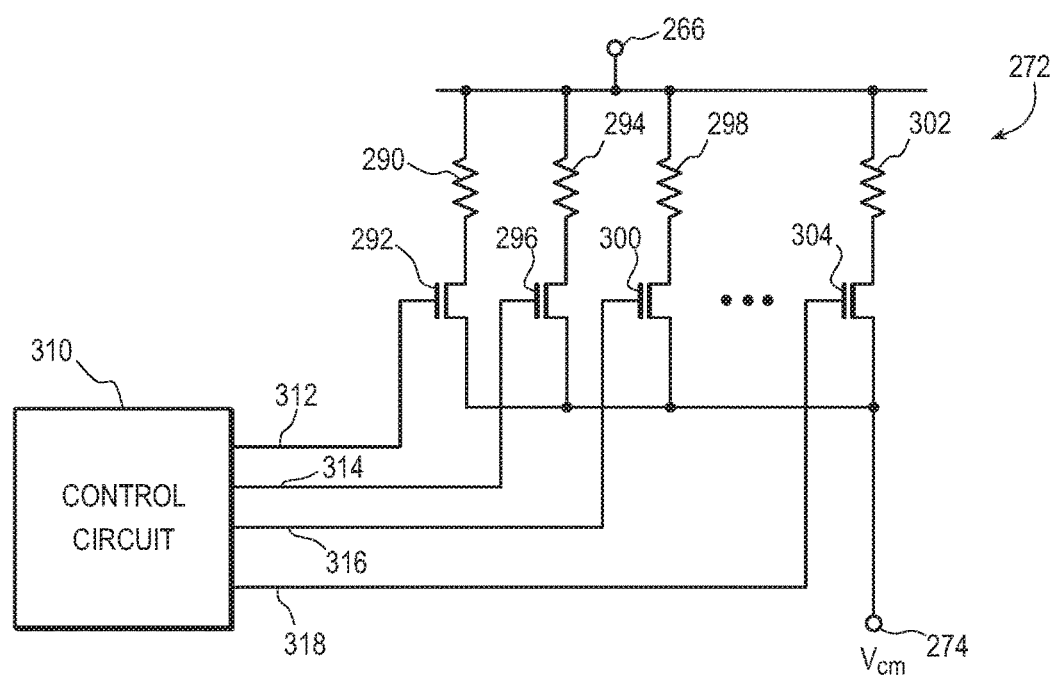
FIG. 11 illustrates further detail of the RDAC in the level acquisition circuit of FIG. 10.

FIG. 11 illustrates further detail of RDAC 272. Resistor 290 is coupled between node 266 and the drain of transistor 292. Resistor 294 is coupled between node 266 and the drain of transistor 296. Resistor 298 is coupled between node 266 and the drain of transistor 300. Resistor 302 is coupled between node 266 and the drain of transistor 304. The gate of transistor 292 is coupled to output 312 of control circuit 310, and the source of transistor 292 is coupled to terminal 274. The gate of transistor 296 is coupled to output 314 of control circuit 310, and the source of transistor 296 is coupled to terminal 274. The gate of transistor 300 is coupled to output 316 of control circuit 310, and the source of transistor 300 is coupled to terminal 274. The gate of transistor 304 is coupled to output 318 of control circuit 310, and the source of transistor 304 is coupled to terminal 274. Additional combinations of resistors and transistor can be connected between node 266 and terminal 274 to increase resolution of RDAC 272.

In FIG. 11, $R_{272}$ is the parallel combination of those resistors 290, 294, 298, and 302 having respective conducting transistors. Resistor 290 is largest value, resistor 294 is smaller than resistor 290, resistor 298 is smaller than resistor 294, and resistor 302 is the smallest value. In one embodiment, the value of resistor 290 is $R/2^0$, resistor 294 is $R/2^1$, resistor 298 is $R/2^{N-1}$, and resistor 302 is $R/2^N$, where N is the number of resistors in the network. Outputs 312-318 are controlled by bit 0, bit 1, bit N−1, and bit N of RDAC 272. Additional resistors and transistors combinations can be connected and controlled, as described above, for more levels of switched resistance. RDAC 276 follows a similar structure and operation.

In summary, level acquisition circuit 128 cancels or removes a large DC offset from differential signal 140 from BM TIA 124 during preamble 144 by varying the dynamic time constants of an RC circuit, without adding any penalty in terms of jitter even from the onset of the burst which improves the throughput and efficiency of OLT 102. In the case of a longer preamble, the dynamic time constants can be tuned to optimize the residual voltage ripple across the capacitor and resulting jitter.

While one or more embodiments of the present invention have been illustrated in detail, the skilled artisan will appreciate that modifications and adaptations to those embodiments may be made without departing from the scope of the present invention as set forth in the following claims.

What is claimed:

1. A circuit for controlling a circuit time constant to achieve a substantially zero DC offset in an optical data signal, comprising:
   a first variable capacitor coupled between a first terminal of the circuit and a second terminal of the circuit;
   a first transistor including a first conduction terminal coupled to the second terminal of the circuit and a second conduction terminal coupled for receiving a common mode reference signal; and
   a control circuit including a first output coupled to a control terminal of the first transistor, wherein an output signal of the control circuit monotonically increases a resistance between the first conduction terminal of the first transistor and second conduction terminal of the first transistor to increase the circuit time constant and achieve the substantially zero DC offset in the optical data signal.

2. The circuit of claim 1, further including:
   a second variable capacitor coupled between a third terminal of the circuit and a fourth terminal of the circuit; and
   a second transistor including a first conduction terminal coupled to the fourth terminal of the circuit and a second conduction terminal coupled for receiving the common mode reference signal, wherein the control circuit includes a second output coupled to a control terminal of the second transistor to monotonically increase a resistance between the first conduction terminal of the second transistor and second conduction terminal of the second transistor to increase the circuit time constant and achieve the substantially zero DC offset in the optical data signal.

3. The circuit of claim 1, wherein the monotonic increase in the circuit time constant is linear.

4. The circuit of claim 1, wherein the monotonic increase in the circuit time constant is non-linear.

5. A circuit for controlling a circuit time constant in an optical data signal, comprising:
   a first variable capacitor coupled between a first terminal of the circuit and a second terminal of the circuit;
   a first transistor including a first conduction terminal coupled to the second terminal of the circuit and a second conduction terminal coupled for receiving a reference signal; and
   a control circuit including a first output coupled to a control terminal of the first transistor to control the circuit time constant, wherein an output signal of the control circuit changes a resistance between the first conduction terminal of the first transistor and second conduction terminal of the first transistor to achieve the substantially zero DC offset in the optical data signal.

6. The circuit of claim 5, further including:
   a second variable capacitor coupled between a third terminal and a fourth terminal; and
   a second transistor including a first conduction terminal coupled to the fourth terminal and a second conduction terminal coupled for receiving the reference signal, wherein the control circuit includes a second output coupled to a control terminal of the second transistor.

7. The circuit of claim 5, wherein the monotonic increase in the circuit time constant is non-linear.

8. A method of making a circuit for controlling a circuit time constant in an optical data signal, comprising:
   providing a first variable capacitor coupled between a first terminal of the circuit and a second terminal of the circuit;
   providing a first transistor including a first conduction terminal coupled to the second terminal of the circuit and a second conduction terminal coupled for receiving a reference signal; and
   providing a control circuit including a first output coupled to a control terminal of the first transistor to change a resistance between the first conduction terminal of the first transistor and second conduction terminal of the first transistor to control the circuit time constant.

9. The method of claim 8, further including:
   providing a second variable capacitor coupled between a third terminal and a fourth terminal; and
   providing a transistor including a first conduction terminal coupled to the fourth terminal and a second conduction terminal coupled for receiving the reference signal, wherein the control circuit includes a second output coupled to a control terminal of the second transistor.

10. The method of claim 8, wherein the monotonic increase in the circuit time constant is non-linear.

11. The circuit of claim 8, wherein the reference signal is a common mode reference signal.

12. The circuit of claim 8, wherein the monotonic increase in the circuit time constant is linear.

13. The circuit of claim 5, wherein the reference signal is a common mode reference signal.

14. The circuit of claim 5, wherein the monotonic increase in the circuit time constant is linear.

\* \* \* \* \*